United States Patent
Yang et al.

(10) Patent No.: US 8,188,447 B2
(45) Date of Patent: May 29, 2012

(54) FIELD-BY-FIELD LASER ANNEALING AND FEED FORWARD PROCESS CONTROL

(75) Inventors: Chung-Ru Yang, Chung-Ho (TW); Chyi Shyuan Chern, Taipei (TW); Soon Kang Huang, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 559 days.

(21) Appl. No.: 12/359,682

(22) Filed: Jan. 26, 2009

(65) Prior Publication Data

US 2010/0187444 A1    Jul. 29, 2010

(51) Int. Cl.
*A61N 5/00* (2006.01)
*G21G 5/00* (2006.01)

(52) U.S. Cl. .............. 250/492.2; 438/149; 438/216; 438/618; 438/591; 438/199; 438/757

(58) Field of Classification Search ........... 250/492.2; 438/149, 216, 618, 591, 199, 757
See application file for complete search history.

(56) References Cited

U.S. PATENT DOCUMENTS

2008/0286885 A1* 11/2008 Izikson et al. ............ 438/7
2008/0316442 A1* 12/2008 Adel et al. ................ 355/52

FOREIGN PATENT DOCUMENTS

CN    1501065 A    6/2004

OTHER PUBLICATIONS

Corresponding SIPO Application No. 100032 Office Action dated Jun. 30, 2011, 4 pages.

* cited by examiner

*Primary Examiner* — Jack Berman
*Assistant Examiner* — Meenakshi Sahu
(74) *Attorney, Agent, or Firm* — Duane Morris LLP

(57) ABSTRACT

A method includes dividing a semiconductor wafer into a plurality of dies areas, generating a map of the semiconductor wafer, scanning each of the plurality of die areas of the semiconductor wafer with a laser, and adjusting a parameter of the laser during the scanning based on a value of the die areas identified by the map of the semiconductor wafer. The map characterizing the die areas based on a first measurement of each individual die area.

21 Claims, 6 Drawing Sheets

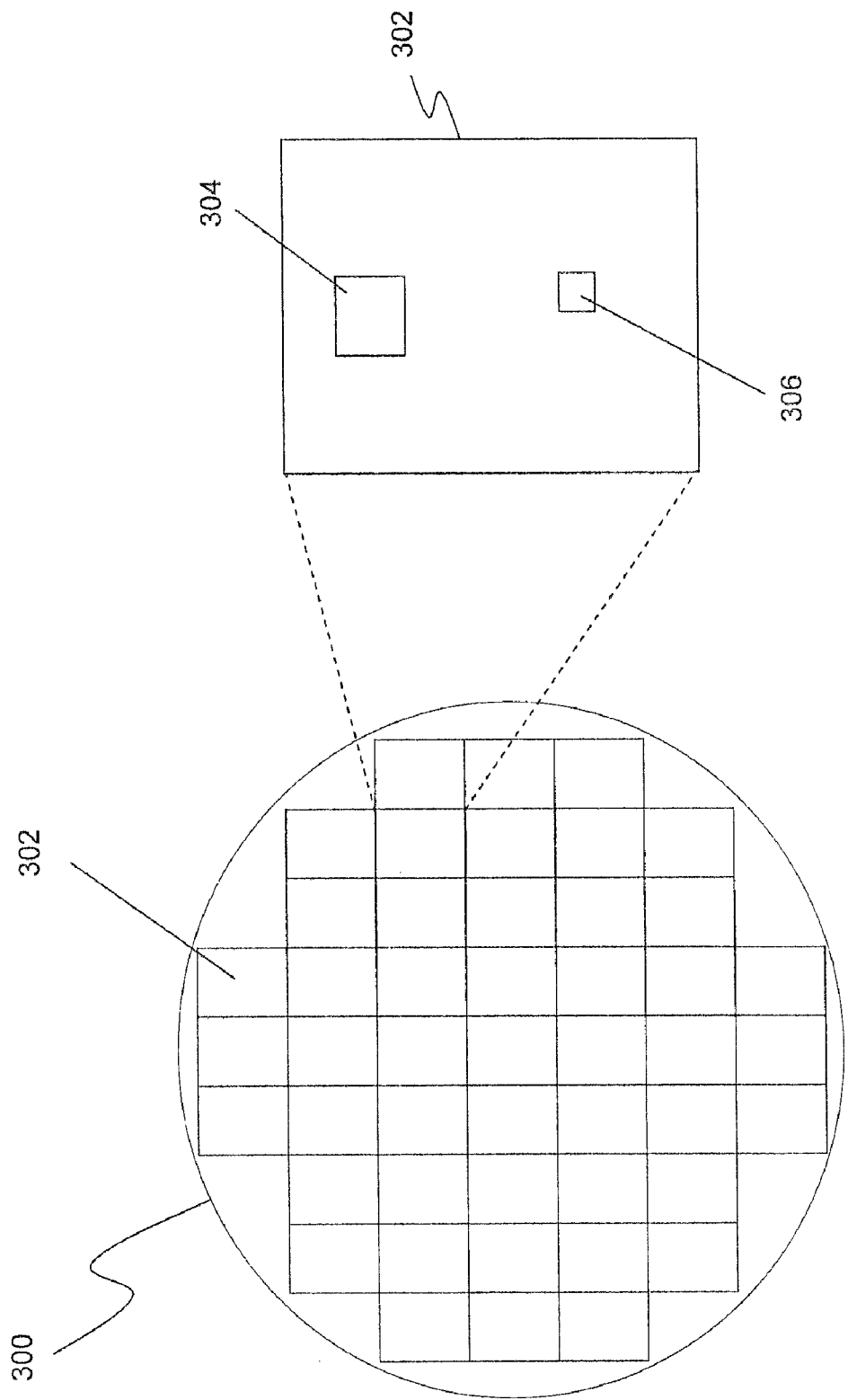

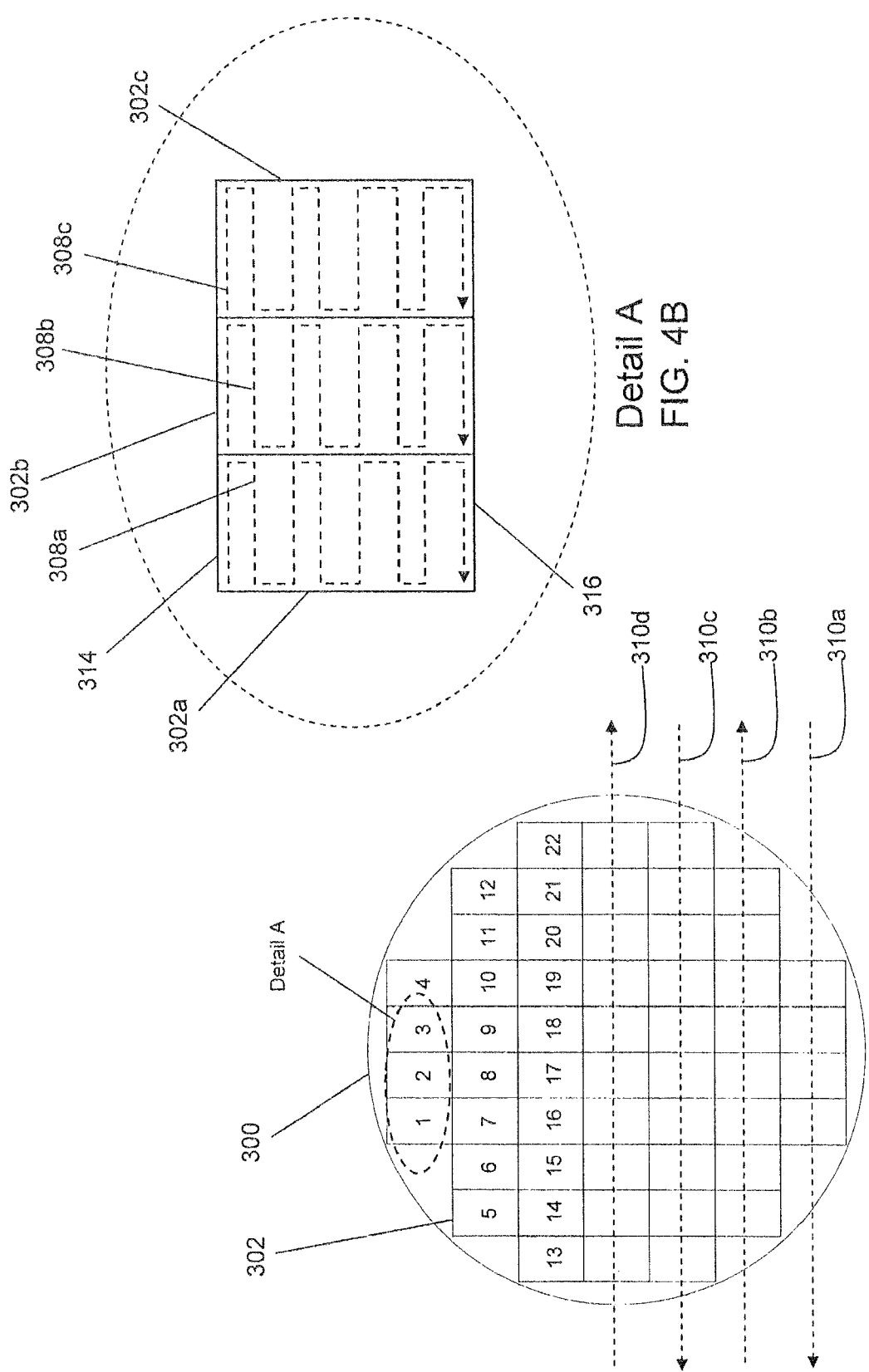

FIELD-BY-FIELD LASER ANNEALING AND FEED FORWARD PROCESS CONTROL

FIELD OF DISCLOSURE

The disclosed system and method relate to semiconductor processing. More specifically, the disclosed system and method relate to wafer scanning and annealing.

BACKGROUND

Semiconductors devices are increasingly being scaled down and gate dielectrics become thinner. At such a small dimension, any tunneling through a gate dielectric layer to the underlying channel region significantly increases gate-to-channel leakage current and increases power consumption. Gate dielectrics are therefore required to have high density and fewer pores.

High-k materials are commonly used as gate dielectrics for MOSFET devices. However, high-k materials have the disadvantage that their densities are lower than conventional thermally grown, low-k silicon dioxide. One of the methods of improving density is annealing, by which the material density is increased and thus electrical properties are improved.

Some conventional methods of gate-dielectric annealing are performed by rapid thermal annealing (RTA) or furnace annealing, which requires temperature as high as around 700° C. Since wafers are typically kept at high temperature for a long period, conventional rapid thermal annealing and furnace annealing have drawbacks of agglomeration formation, high thermal budget cost, and high diffusion of impurities.

Laser spike annealing (LSA) has been developed to overcome the shortfalls of RTA. Conventional methods of LSA involve arc scanning in which the laser is scanned in an arc across the semiconductor wafer. For example, FIGS. 1A and 1B illustrate a conventional LSA arc-scanning process of a semiconductor wafer 100. As shown in FIG. 1A, a semiconductor wafer 100 is placed on a pedestal 102 which may move as indicated by the arrows. A laser source 104 directs a beam of light 106 onto the semiconductor wafer 100 at an angle θ from an axis normal to the plane of the semiconductor wafer 100. FIG. 1B illustrates the conventional scanning paths 108a-108g of the laser beam 106 across the surface of the semiconductor wafer 100. In a conventional arc-scanning process, the laser beam 106 will scan path 108a first followed by 108b and so on until the final inverted "fill-in" scan 108g is performed.

While these conventional methods of LSA arc-scanning overcome some of the disadvantages of RTA, a semiconductor wafer 100 may have large variations in material characteristics that are difficult to account for using the conventional LSA methodology. The material variations may extend from one die to another which may negatively affect the performance of the integrated circuits formed on the dies and wafer 100.

Accordingly, an improved method of laser annealing for semiconductor wafers is desirable.

SUMMARY

In some embodiments, a method includes dividing a semiconductor wafer into a plurality of dies areas, generating a map of the semiconductor wafer, scanning a first one of the plurality of die areas of the semiconductor wafer with a laser, adjusting a parameter of the laser based on the map of the semiconductor wafer and a value of the first measurement associated with a second one of the plurality of die areas, and scanning the second die area. The map characterizing the die areas based on a first measurement of each individual die area. The adjusting being performed after scanning the first die area.

In some embodiments, a system includes a laser light source, a pedestal, and a processor in signal communication with the laser light source and the pedestal. The pedestal is configured to hold a semiconductor wafer. One of the laser light source and the pedestal is configured to move in relation to the other of the laser light source and the pedestal. The processor is configured to divide the semiconductor wafer into a plurality of die areas, control the relative movement between the pedestal and the laser light source, and adjust a parameter of the laser light source individually for scanning each of the die areas based on a map of the semiconductor wafer. The map characterizes the individual die areas of the semiconductor wafer based on a respective value or a first measurement taken in each respective die area.

In some embodiments, a machine readable storage medium is encoded with program code. When the program code is executed by a processor, the processor performs a method. The method includes dividing a semiconductor wafer into a plurality of dies areas, generating a map of the semiconductor wafer, scanning a first one of the plurality of die areas of the semiconductor wafer with a laser, adjusting a parameter of the laser based on the map of the semiconductor wafer and a value of the first measurement associated with a second one of the plurality of die areas, and scanning the second die area. The map characterizing the die areas based on a first measurement of each individual die area. The adjusting being performed after scanning the first die area.

BRIEF DESCRIPTION OF THE DRAWINGS

FIG. 3A illustrates a semiconductor wafer divided into a plurality of die areas in accordance with the laser annealing method illustrated in FIG. 2.

FIG. 3B illustrates an example of areas of dies that undergo Rs and Tw measurements in accordance with the wafer embodiment illustrated in FIG. 3A.

FIG. 4A illustrates a semiconductor wafer divided into a plurality of dies and a scanning sequence of the dies in accordance with the method illustrated in FIG. 2.

FIG. 4B illustrates one embodiment of a scanning path of a laser scanning a die located on a semiconductor wafer in accordance with the method illustrated in FIG. 2.

DETAILED DESCRIPTION

An improved system and method for performing a laser spike annealing (LSA) scan is now described. The LSA scan may be controlled by a processor 601 as shown in FIG. 6.

Figure 6:
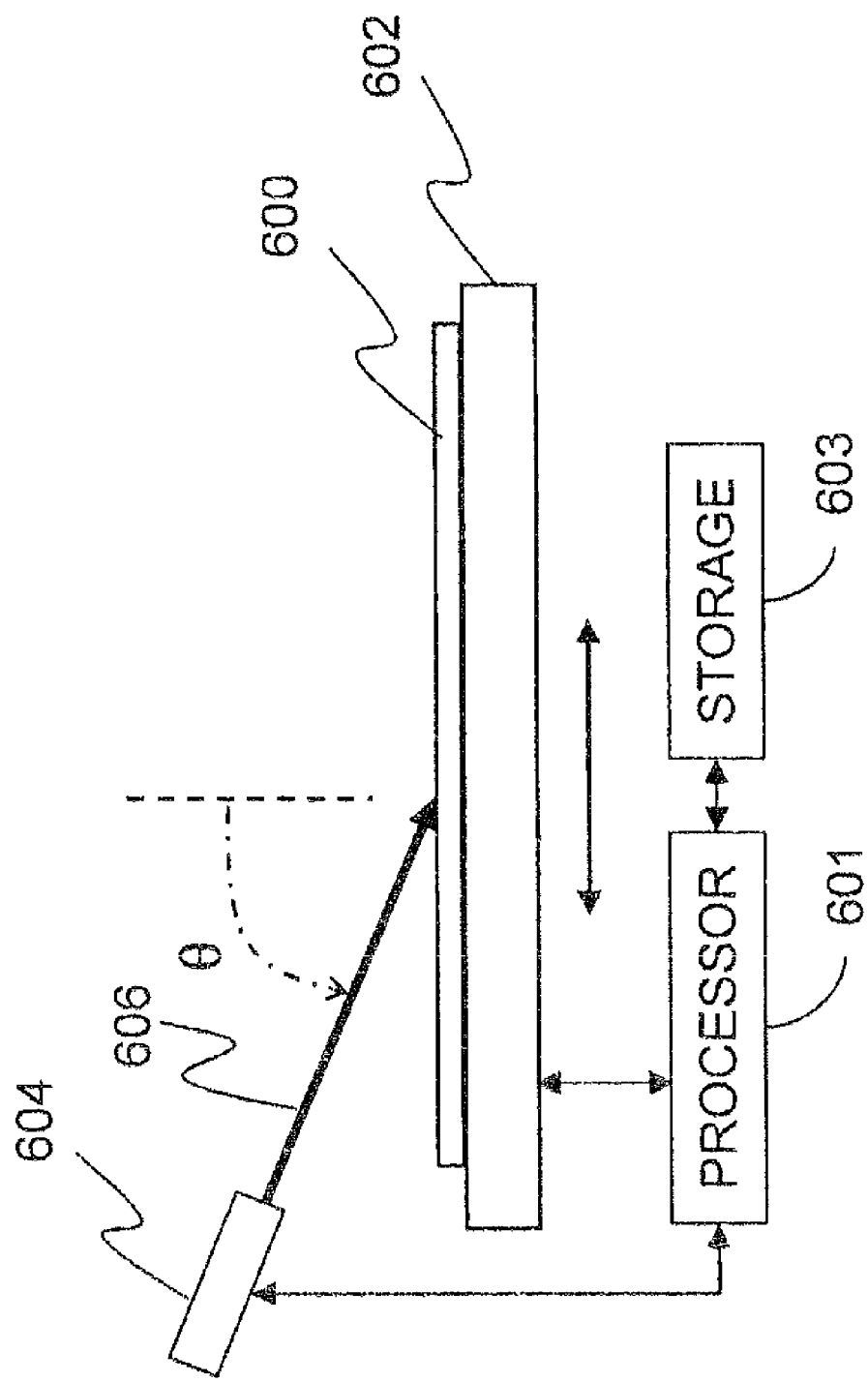
FIG. 6 is a block diagram of an exemplary laser scanning system.

FIG. 6 is a block diagram of an exemplary system. As shown in FIG. 6, a semiconductor wafer 600 is placed on a pedestal 602 which may move as indicated by the arrows. A laser source 604 directs a beam of light 606 onto the semiconductor wafer 600 at an angle θ from an axis normal to the plane of the semiconductor wafer 600. Processor 601 controls at least one parameter of the laser source 604, and receives information from the laser (which may include the laser parameter settings and/or measurements). The processor 601 is also coupled to the pedestal 602 for controlling the pedestal and receiving position data from the pedestal. The processor 601 reads data and computer program instructions from a computer readable storage medium 603 and stores data in the computer readable storage medium.

Figure 1:
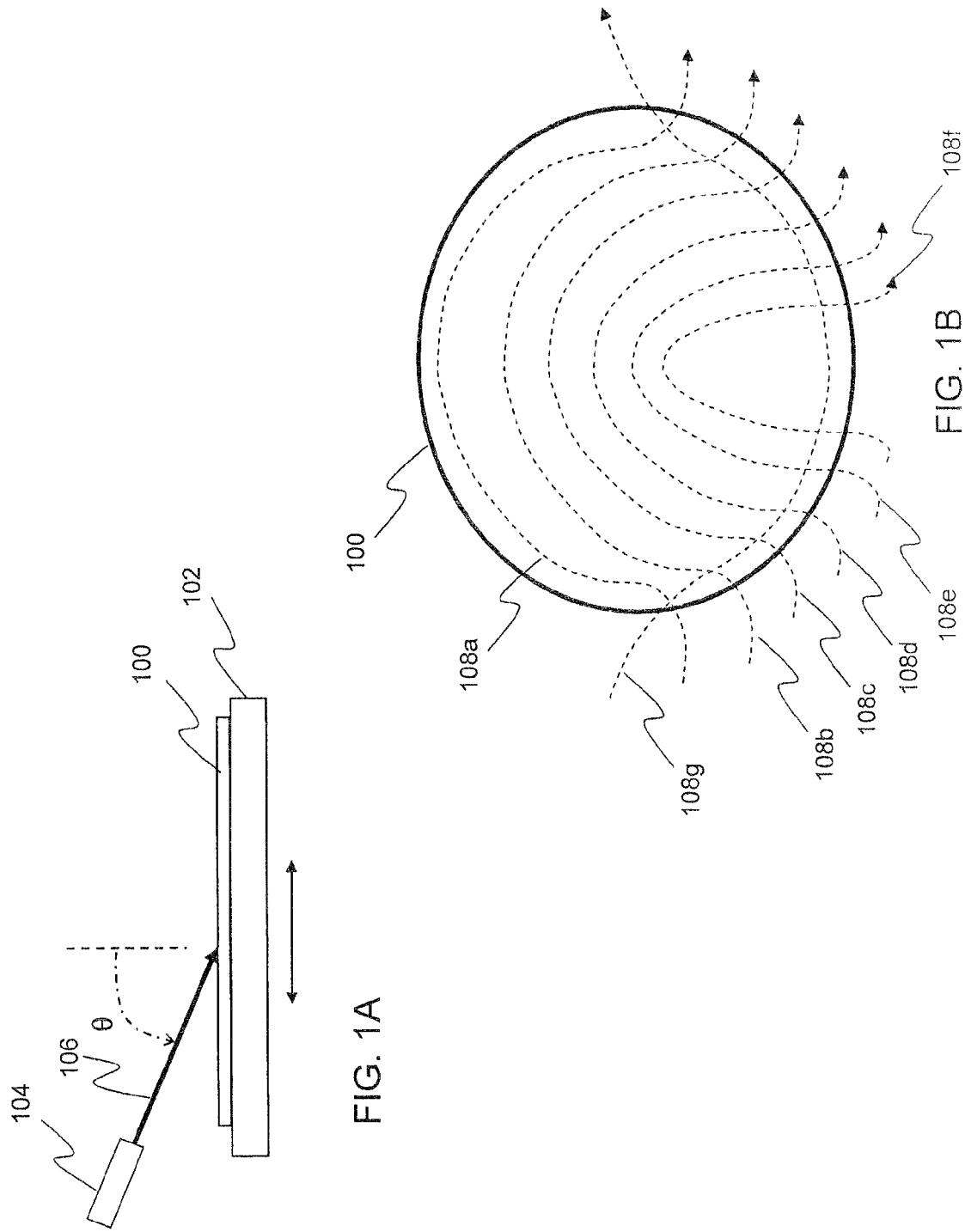
FIG. 1A illustrates a conventional laser scanning arrangement.
FIG. 1B illustrates a scanning path of a conventional laser scanning annealing system.
Figure 2:
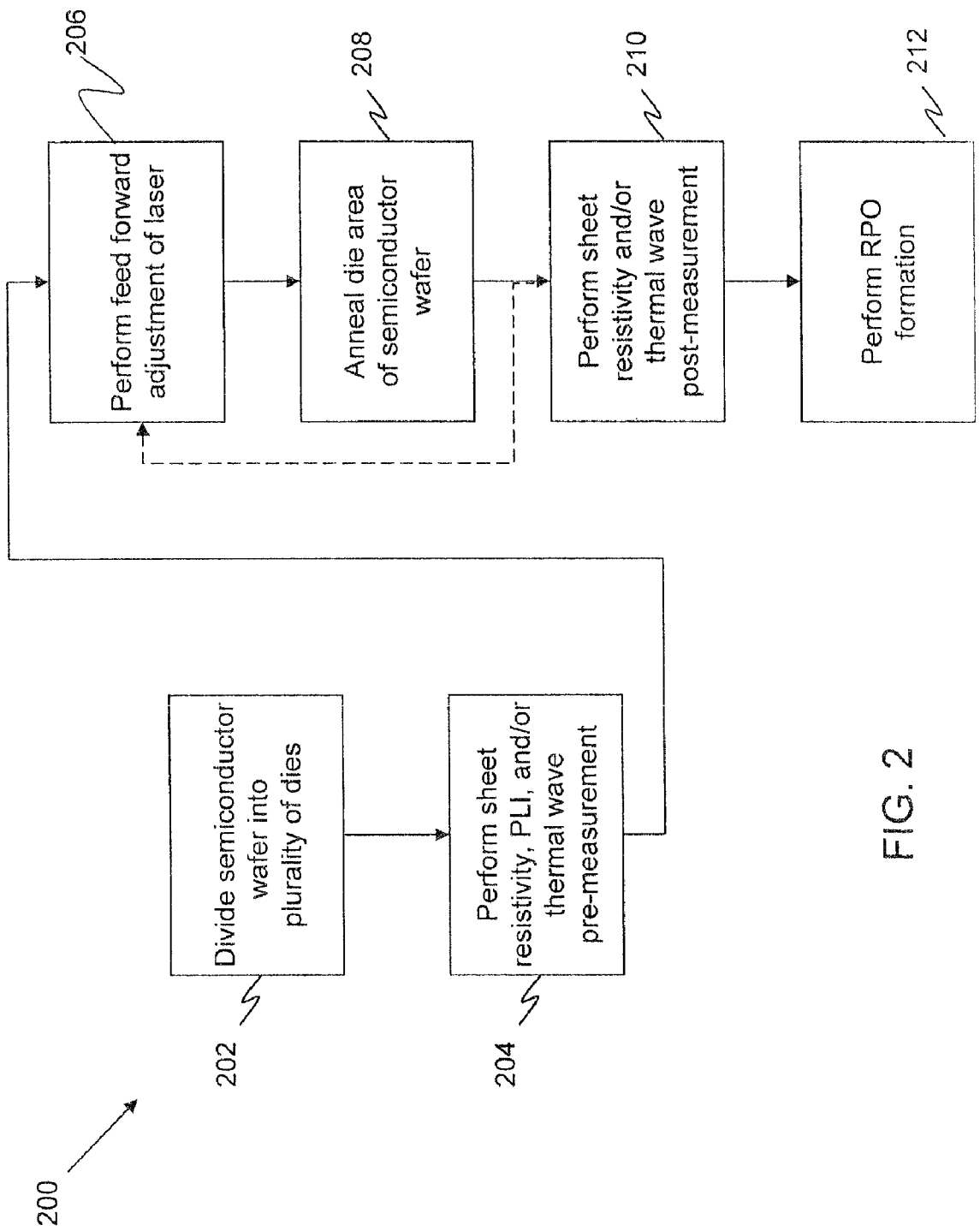
FIG. 2 is a flow diagram of an improved laser annealing method.
Figure 5A:
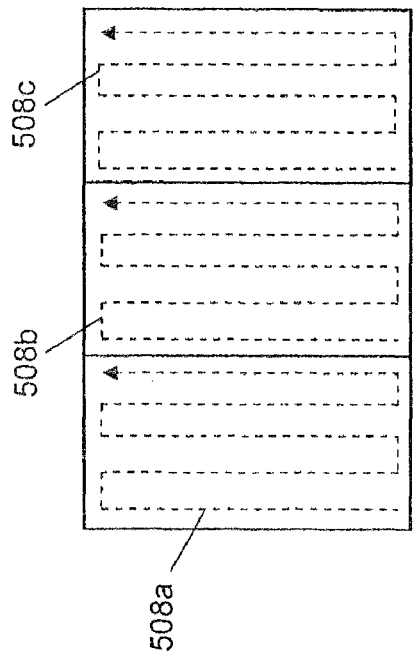
FIG. 5A illustrates another embodiment of a scanning path of a laser scanning a die located on a semiconductor wafer in accordance with the method illustrated in FIG. 2.
Figure 5B:
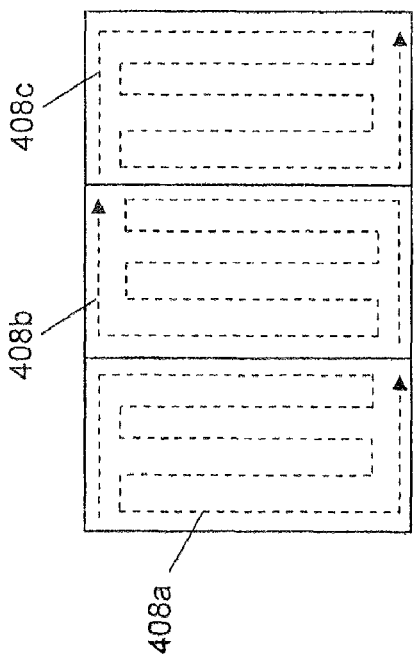
FIG. 5B illustrates another embodiment of a scanning path of a laser scanning a die located on a semiconductor wafer in accordance with the method illustrated in FIG. 2.
Figure 5C:
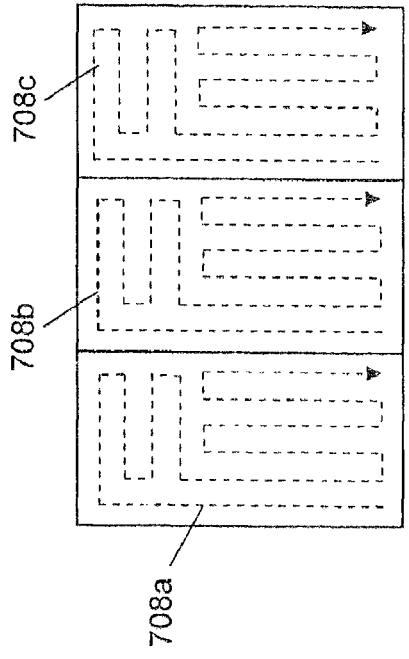
FIG. 5C illustrates another embodiment of a scanning path of a laser scanning a die located on a semiconductor wafer in accordance with the method illustrated in FIG. 2.
Figure 5D:
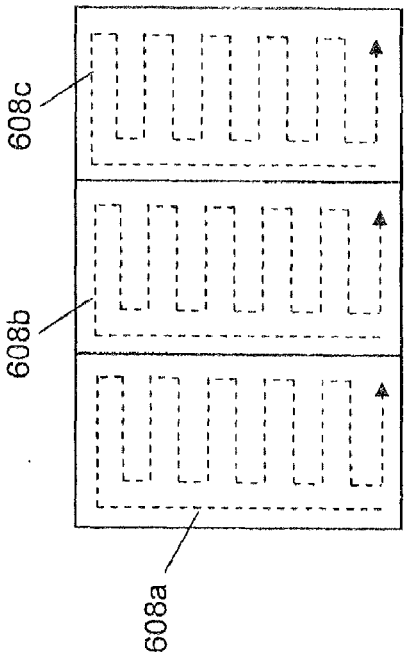
FIG. 5D illustrates another embodiment of a scanning path of a laser scanning a die located on a semiconductor wafer in accordance with the method illustrated in FIG. 2.

FIG. 2 is a flow diagram of one embodiment of an improved method of performing a LSA scan 200. At block 202, the semiconductor wafer 300 is divided into one or more dies 302 as shown in FIG. 3A.

At block 204, pre-annealing sheet resistance measurements 304 and/or thermal wave measurements 306 may be performed on test structures at several locations in each of the one or more dies 302, and the measurements stored in a computer readable storage medium 603. In some embodiments, the one or more sheet resistance measurements 304 may be performed over 1 mm by 1 mm areas of dies 302, and the one or more thermal wave measurements 306 may be performed over 50 μm by 50 μm areas of dies 302. However, one skilled in the art will understand that other dimensions for the one or more sheet resistance measurements 304 and thermal wave measurements 306 may be performed. Additionally, one skilled in the art will understand that other measurements including, but not limited to, Photo Luminescence Imaging (PLI) measurements, may be performed.

The sheet resistance and thermal wave measurements may be used to create a map of the semiconductor wafer 300 on a per die basis. The map of the die 302 may identify defects within each die 302 of the wafer 300. Some of these defects detected during the sheet resistance measurements 304 or the thermal wave measurements 302 may be alleviated by LSA scanning. For example, thermal wave imaging of the wafer 300 may identify areas of a die 302 having high concentrations of dopant impurities that may be the result of ion implantation of the wafer 300. These high concentrations of dopant impurities may be alleviated by the LSA scanning, which may diffuse or even out the high dopant concentrations. The map generated by the pre-scanning measurements of the wafer 100 may be stored in a computer readable storage medium 603 and used during the LSA scanning to adjust the properties of the laser beam as described below.

At block 206, the map generated by the pre-annealing measurements may be used by processor 601 to adjust the parameters of the laser individually for each die while the LSA scanning is performed. For example, the intensity of the laser may be adjusted individually for each die, to provide the amount of annealing needed to correct defects or to activate dopants. The map may be implemented in a feed-forward system such that the adjustable parameters of the laser (e.g., wavelength, intensity, duration of exposure, etc.) may be varied as the laser moves across a semiconductor wafer 300 or a die 302a-302c.

At block 208, field-by-field LSA scanning is performed. FIG. 4A illustrates one example of a scanning sequence (e.g., scanning sequence lines 310a-310d) of the semiconductor wafer 300. The dashed line in FIG. 2 indicates that the steps 206 and 208 can be repeated (i.e., the laser can be adjusted each time another die is to be annealed). As shown in FIG. 4A, the LSA scan of the wafer 300 may be performed through a plurality of linear scanning passes 310a-310d in which the dies 302 are sequentially scanned. For example, a row or column of the dies 302 may be sequentially scanned as shown by scanning sequence lines 310a-310d. One skilled in the art will understand that the scanning sequence may be performed from left-to-right, right-to-left, top-to-bottom, bottom-to-top, or the like. Additionally, one skilled in the art will understand that the dies 302 may be scanned in a nonlinear or non-sequential pattern as well.

Detail A of FIG. 4A is shown in FIG. 4B and illustrates one example of the scanning paths 308a-308c of the laser beam. Note that, although the laser is described as moving in relation to wafer 300, the wafer 300 may be on a pedestal that moves the wafer 300 in relation to the laser beam. An example of a commercially available pedestal includes, but is not limited to, an Ultra LSA 100 pedestal. As shown in FIG. 4B, the scanning paths 308a-308c of the laser beam may wind from one portion (e.g., top portion 314) of die 302a to another portion (e.g., lower portion 316b). Once a die 302a has been scanned, then the laser beam may move to another die, e.g., adjacent die 302b, as identified by the scanning sequences 310a-310d shown in FIG. 4A. The scan path 308b of the next die 302b may be identical to the scan path 308a of the previous die 302a. In some embodiments, scan paths 308a-308c are not identical to each other and may be implemented such that the laser may seamlessly move from one die 302a to a second die 302b without turning off.

FIGS. 5A-5D illustrate various scanning paths 408a-408c, 508a-508c, 608a-608c, and 708a-708c that may also may be implemented. One skilled in the art will understand that other in-die scanning paths may be implemented that scan the entire wafer.

At block 210, post-scanning sheet resistance measurements or thermal wave measurements of the wafer 300 may be performed. These post-scan measurements may be used to confirm parameters of the laser scanning and to ensure that the advanced process control is optimal. For example, if the post-scan measurements, e.g., the Rs, TW, and/or PLI measurements, identify that the wafer does not have uniform characteristics, then a parameter of the laser scanning (e.g., length of scan, wavelength of laser, intensity of laser) may be adjusted using a feed forward control system.

At block 212, the wafer 300 may undergo resistance protective oxide (RPO) formation as well as additional processing steps necessary to finish the integrated circuitry.

Dividing the semiconductor wafer into a plurality of dies 302a-302c and scanning the semiconductor wafer 300 on a per die 302a-302c basis advantageously enables each die 302a-302c to be annealed in such a manner that the properties of the dies 302a-302c are more uniform than may be achieved through conventional arc scanning.

The present invention may be embodied in the form of computer-implemented processes and apparatus for practicing those processes. The present invention may also be embodied in tangible machine readable storage media encoded with computer program code, such as random access memory (RAM), floppy diskettes, read only memories (ROMs), CD-ROMs, blu-ray disk, DVD ROM, hard disk drives, flash memories, or any other machine-readable storage medium, wherein, when the computer program code is loaded into and executed by a computer, the computer becomes a particular machine for practicing the invention. When implemented on a general-purpose processor, the computer program code segments configure the processor to create specific logic circuits. The invention may alternatively be embodied in a digital signal processor formed of application specific integrated circuits for performing a method according to the principles of the invention.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method, comprising:
    providing a semiconductor wafer having a plurality of die areas;
    measuring a characteristic of a test structure in each individual die area to create a map of the semiconductor wafer, the map identifying at least one defect at one or more locations on the semiconductor wafer; and
    for each individual die area:
        (1) adjusting a parameter of a laser based on the map of the measured characteristic of the test structure in that die area; and
        (2) annealing that die area with the laser adjusted based on the measured characteristic of the test structure in that die area so as to alleviate the defect.

2. The method of claim 1, wherein the measuring is performed at a plurality of locations within each individual die area.

3. The method of claim 1, wherein the measuring is one of a sheet resistance measurement, a thermal wave measurement, or a Photo Luminescence Imaging (PLI) measurement of the test structure on the semiconductor wafer.

4. The method of claim 1, wherein the step of measuring a characteristic of a test structure includes storing a result of the measuring in a computer readable storage medium.

5. The method of claim 1, wherein the parameter is an intensity of the laser.

6. The method of claim 1, wherein the parameter is a wavelength of the laser.

7. The method of claim 1, wherein the parameter is a duration of the laser scan.

8. A system, comprising:
    a laser light source;
    a pedestal configured to hold a semiconductor wafer, wherein one of the laser light source and the pedestal is configured to move in relation to the other of the laser light source and the pedestal; and
    a processor in signal communication with the laser light source and the pedestal, the processor configured to:
        control the relative movement between the pedestal and the laser light source; and
        adjust a parameter of the laser light source individually for scanning each of a plurality of die areas so as to alleviate at least one defect in the semiconductor wafer based on a map of the semiconductor wafer, the map characterizing the individual die areas of the semiconductor wafer based on a respective value of a first measurement taken in each respective die area such that one or more locations of the at least one defect in the semiconductor wafer are identifiable.

9. The system of claim 8, wherein the first measurement is a sheet resistance measurement.

10. The system of claim 9, wherein the first measurement is a thermal wafer measurement.

11. The system of claim 9, wherein the parameter of the laser light source is an intensity of the laser light.

12. The system of claim 9, wherein the parameter of the laser light source is a wavelength of the laser light.

13. A machine readable storage medium encoded with program code, wherein when the program code is executed by a processor, the processor performs a method, the method comprising:
    receiving a map of a measurement of a characteristic of a test structure in each of a plurality of individual die areas of a semiconductor wafer, the map identifying at least one defect at one or more locations; and
    for each individual die area:
        (1) adjusting a parameter of a laser based on the map of the measured characteristic of the test structure in that die area; and
        (2) controlling the laser to anneal that die area with the laser adjusted based on the map of the measured characteristic of the test structure in that die area so as to alleviate the defect.

14. The machine readable storage medium of claim 13, wherein the measuring is performed at a plurality of locations within each individual die area.

15. The machine readable storage medium of claim 13, wherein the measuring includes taking a sheet resistance measurement of the semiconductor wafer.

16. The machine readable storage medium of claim 13, wherein the measurement includes taking a thermal wave measurement.

17. The machine readable storage medium of claim 13, wherein the measuring is taking a Photo Luminescence Image of the semiconductor wafer.

18. The machine readable storage medium of claim 13, wherein the parameter is an intensity of the laser.

19. The machine readable storage medium of claim 13, wherein the parameter is a wavelength of the laser.

20. The machine readable storage medium of claim 13, wherein the parameter is a duration of the laser scan.

21. The method of claim 1, wherein the defect is a high concentration of dopant impurities and the laser is adjusted so as to alleviate the defect by diffusing the dopant impurities in the semiconductor wafer.

* * * * *